United States Patent
Lee (10) Patent No.: US 7,368,748 B2
(45) Date of Patent: May 6, 2008

(54) TEST PIXEL AND TEST PIXEL ARRAY FOR EVALUATING PIXEL QUALITY IN CMOS IMAGE SENSOR

(75) Inventor: Won-Ho Lee, Ichon-shi (KR)

(73) Assignee: MagnaChip Semiconductor, Ltd., Cheongju (KR)

( * ) Notice: Subject to any disclaimer, the term of this patent is extended or adjusted under 35 U.S.C. 154(b) by 936 days.

(21) Appl. No.: 10/745,749

(22) Filed: Dec. 23, 2003

(65) Prior Publication Data
US 2004/0218076 A1 Nov. 4, 2004

(30) Foreign Application Priority Data
Apr. 30, 2003 (KR) .................. 10-2003-0027773

(51) Int. Cl.
*H01L 23/58* (2006.01)
(52) U.S. Cl. ................. 257/48; 257/E23.179
(58) Field of Classification Search ............ 257/48, 257/E23.179; 438/11, 14, 15, 18
See application file for complete search history.

(56) References Cited

U.S. PATENT DOCUMENTS 6,992,327 B2 * 1/2006 Tone et al. .................. 257/48

* cited by examiner

*Primary Examiner*—Hoai V Pham
(74) *Attorney, Agent, or Firm*—Blakely, Sokoloff, Taylor & Zafman LLP (57) ABSTRACT

A test pixel for use in a CMOS image sensor is employed to evaluate a pixel quality by modulating a contact chain. The test pixel for use the CMOS image sensor including: a test pixel active area corresponding to each unit pixel active area, wherein the unit pixel active area has a floating diffusion contact, a VDD contact and an output contact therein; an active area contact having a first, a second and a third contacts disposed at predetermined locations of each test pixel active area, wherein the first, the second and the third contacts are correspondent to the floating diffusion contact, the VDD contact and the output contact in the unit pixel, respectively; a contact chain in order for a test current to flow vertically or a horizontally through the active area contact; a test pad having a first test pad and a second test pad; and a test gate of which a predetermined portion is overlapped over the test pixel active area, for applying a predetermined signal thereto.

9 Claims, 9 Drawing Sheets

TEST PIXEL AND TEST PIXEL ARRAY FOR EVALUATING PIXEL QUALITY IN CMOS IMAGE SENSOR

FIELD OF THE INVENTION

The present invention relates to a semiconductor device; and, more particularly, to a test pixel and a test pixel array for evaluating a pixel quality such as a contact resistance or a leakage current in a complementary metal oxide semiconductor (CMOS) image sensor.

DESCRIPTION OF THE PRIOR ART

As is well known, a complementary metal oxide semiconductor (CMOS) image sensor is a device that converts an optical image to an electrical signal using a CMOS manufacturing technology, which employs a switching scheme of an MOS transistor for transporting photo-electric charges from a photodiode to an output node as well as detection of an output signal at the output node.

In general, the conventional unit pixel in the CMOS image sensor includes one photodiode and four NMOS transistors. The four transistors include a transfer transistor for transferring the photo-electric charges generated from the photodiode to a floating diffusion region, a reset transistor for discharging the charges stored in the floating diffusion region to detect subsequent signals, a drive transistor acting as a source follower, and a select transistor for switching and addressing.

Figure 1:
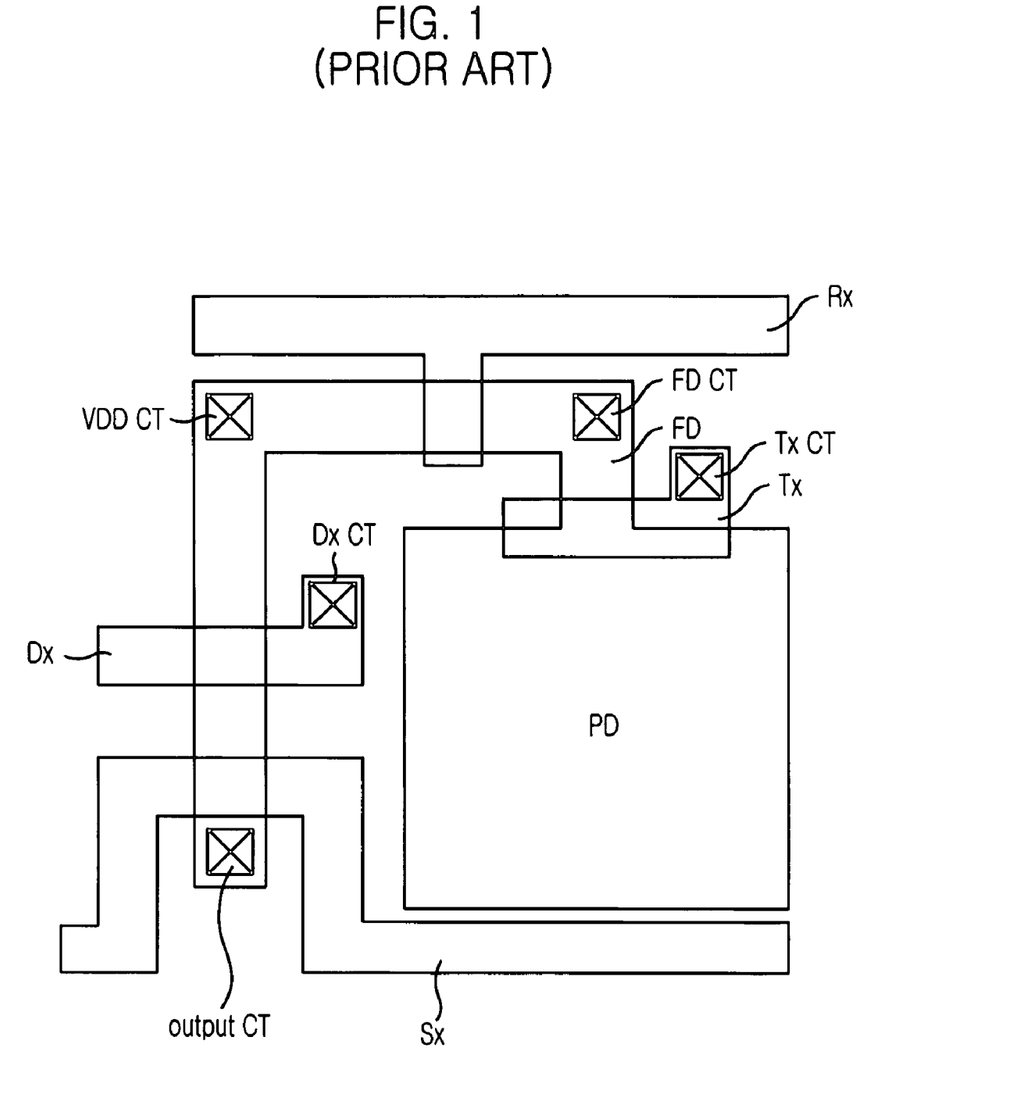
FIG. 1 is a plane view setting forth an exemplary unit pixel in a complementary metal oxide semiconductor (CMOS) image sensor.

Referring to FIG. 1, there is shown a plane view setting forth an exemplary unit pixel in a CMOS image sensor.

In FIG. 1, one side of a transfer transistor (Tx) is overlapped a predetermined portion of an active area where the photodiode (PD) will be formed. At the other side of the transfer transistor (Tx), there is formed the floating diffusion region (FD). From the photodiode (PD) to the floating diffusion region (FD), a pathway area is reduced like a bottle neck, wherein the photodiode (PD) has relatively a large area in comparison with the others. In a counterclockwise direction from the photodiode (PD), there are formed a reset transistor, a drive transistor and a select transistor respectively, wherein a gate electrode of each transistor is separated by each predetermined distance.

The exemplary unit pixel has five contacts including a transfer contact (Tx CT) for applying a transfer control signal to a gate of the transfer transistor (Tx), a floating diffusion contact (FD CT) connected to the floating diffusion region, a drive contact (Dx CT) connected to a gate of the drive transistor (Dx), a power supply voltage contact (VDD CT) for applying a VDD and an output contact (output CT) for an output terminal of the unit pixel.

Typically, a bad pixel fail, e.g., a dark pixel or a white pixel, is a detrimental factor causing to reduce a yield of the CMOS image sensor in mass-production. This is incurred by a leakage current generated between metal interconnection contacts (MIC) of adjacent unit pixels. In particular, when there are bad pixels in a number of about two hundred thousand to about a million in the unit pixel array, the CMOS image sensor a bad pixel quality. Therefore, to address the above problem, it is very important to monitor and analyze a contact resistance of each contact in the unit pixel using a test pixel.

Figure 2:
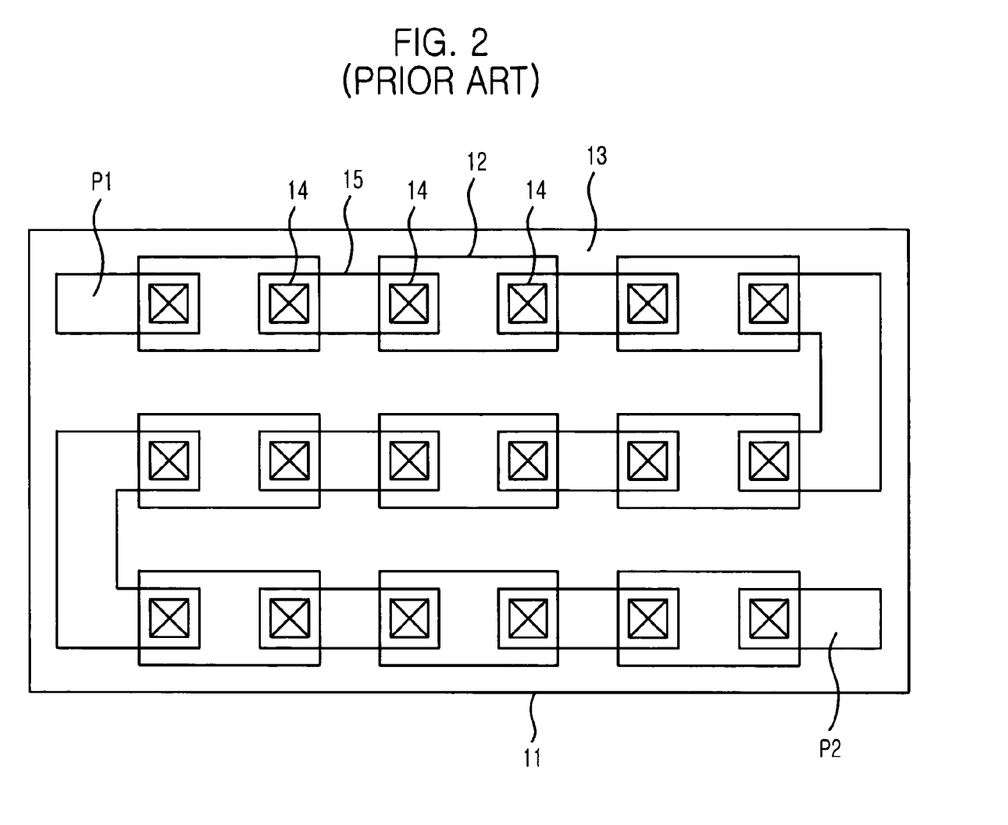
FIG. 2 is a plane view setting forth a conventional test pixel for evaluating a pixel quality in the CMOS image sensor.

Referring to FIG. 2, there is shown a conventional test pixel array for evaluating the contact resistance of the unit pixel in the CMOS image sensor.

In FIG. 2, an active area 12 is electrically isolated by a field oxide (FOX) 13 therebetween in a semiconductor substrate 11. An MIC 14 in one active area 12 is interconnected to an MIC 14 in an adjacent active area 12 by means of a metal interconnection 15. That is, neighboring active areas 12 are interconnected through the metal interconnection 15 like a chain. In ends of the test pixel array, a first pad (P1) and a second pad (P2) are connected for measuring a contact resistance.

A method for measuring a contact resistance of the MIC 14 by means of the conventional test pixel is described in detail as followings.

When a predetermined voltage is applied to the test pad, test current flows through the MIC 14, the metal interconnection 15 and the active area 12. Afterward, the current and a voltage passing through the MICT 14 are measured, respectively, thereby calculating the contact resistance of a mean value.

However, the conventional test pixel suffers from a drawback that it is not concurrently formed in the CMOS image sensor because it has a different layout from an actual unit pixel array. Moreover, since there is no gate terminal, it is impossible to evaluate pixel property in case of a transistor's "on" and "off". Furthermore, the metal interconnection 15 interconnects only MICTs 14 in the active area 12 so that via contacts can not be evaluated simultaneously. Therefore, it is necessary to employ two test pixels of which one measures the contact resistance of the MIC 14 and the other measures that of the via contact. In particular, an active area contact such as the VDD contact, the floating diffusion contact and the output contact is a key element to determine the bad pixel fail so that an accurate measurement data for this active area contact is very important for enhancing the product yield of the CMOS image sensor.

SUMMARY OF THE INVENTION

It is, therefore, an object of the present invention to provide a test pixel for evaluating a pixel quality such as a contact resistance or a leakage property in a complementary metal oxide semiconductor (CMOS) image sensor.

In accordance with one aspect of the present invention, there is provided a unit test pixel for use in a CMOS image sensor, including: a test pixel active area corresponding to a unit pixel active area, the unit pixel active area having a floating diffusion contact, a power supply voltage (VDD) contact and an output contact; an active area contact disposed at a predetermined location of the test pixel active area; a first metal interconnection connected to the test pixel active area through the active area contact; a second metal interconnection connected to the first metal interconnection through the via contacts formed over the first metal interconnection; and a test gate of which a predetermined portion is overlapped over the test pixel active area, for applying a predetermined signal thereto.

In accordance with another aspect of the present invention, there is provided a test pixel in a CMOS image sensor, including: a test pixel active area corresponding to each unit pixel active area, wherein the unit pixel active area has a floating diffusion contact, a VDD contact and an output contact therein; an active area contact having a first, a second and a third contacts disposed at predetermined locations of each test pixel active area, wherein the first, the second and the third contacts are correspondent to the floating diffusion contact, the VDD contact and the output contact in the unit pixel, respectively; a contact chain having a plurality of metal interconnections in order for a test current to flow vertically or horizontally through the active area contact; a test pad having a first test pad and a second test pad, wherein a test current is inputted into the first test pad and is outputted through the second test pad; and a test gate of which a predetermined portion is overlapped over the test pixel active area in the test pixel, for applying a predetermined signal thereto.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 3A and 3B and FIGS. 4 to 8 plane views of a unit test pixel and test pixel arrays in a complementary metal oxide semiconductor (CMOS) image sensor in accordance with preferred embodiments of the present invention.

Figure 3A:
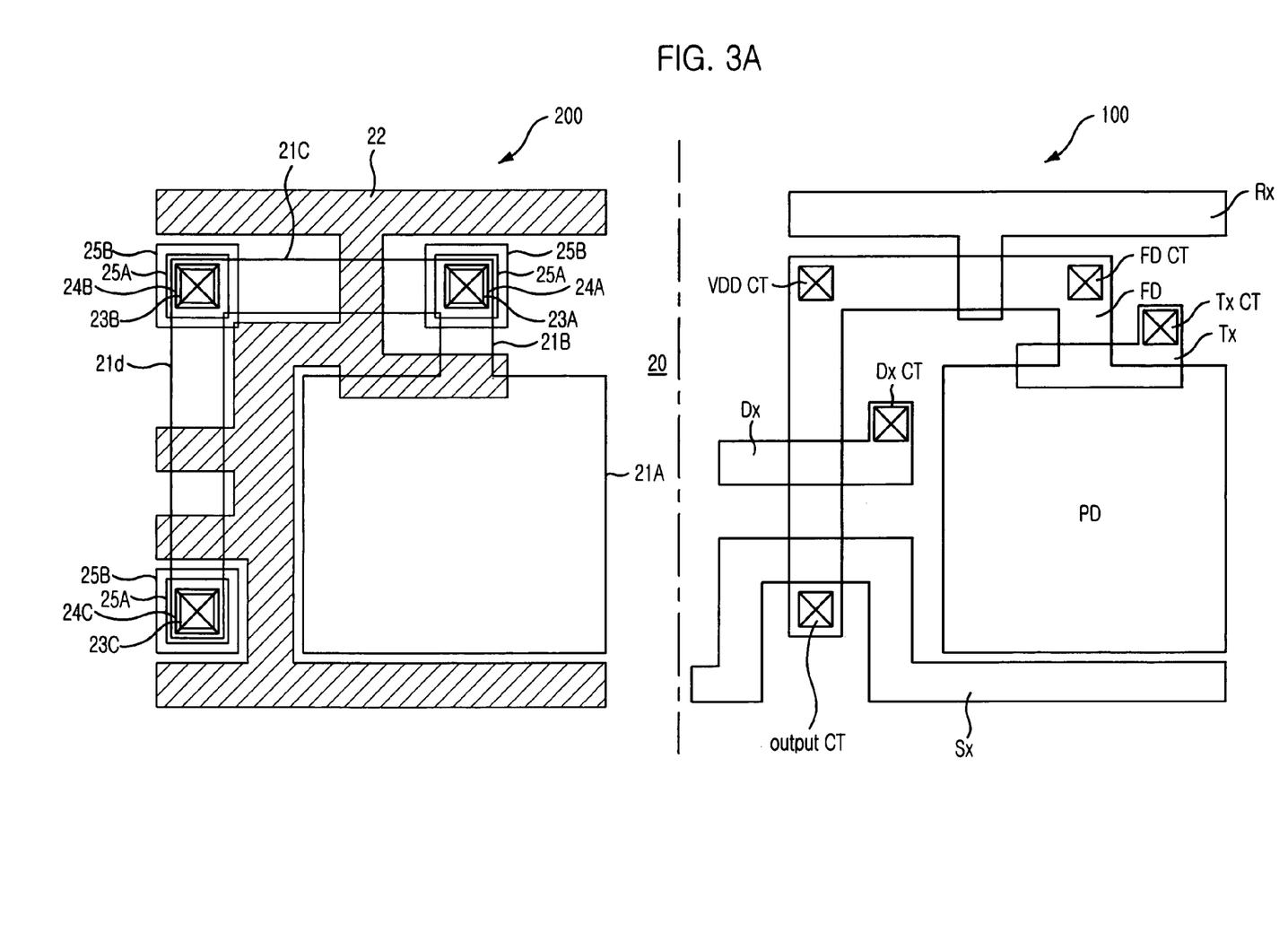
FIG. 3A is a plane view setting forth a unit test pixel and a unit pixel in accordance with a first preferred embodiment of the present invention.

Referring to FIG. 3A, there is shown a plane view setting forth a unit pixel 100 and a unit test pixel 200 in a CMOS image sensor in accordance with a first preferred embodiment of the present invention. In the present invention, the unit pixel 100 and the unit test pixel 200 are concurrently formed during a fabrication of the CMOS image sensor.

In FIG. 3A, a test pixel active area in the unit test pixel 200 which is defined by a FOX 20 has a same configuration to a unit pixel active area in the unit pixel 100. That is, the test pixel active area in the unit test pixel 200 includes a first active area 21A, a second active area 21B, a third active area 21C and a fourth active area 21D. The first active area 21A in the unit test pixel 200 is correspondent to the active area where a photodiode (PD) is formed in the unit pixel 100 and the second active area 21B in the unit test pixel 200 is correspondent to the active area where a floating diffusion region (FD) is formed in the unit pixel 100. In addition, the third active area 21C in the unit test pixel 200 is correspondent to the active area in which the reset transistor (Rx) is formed in the unit pixel 100 and the fourth active area 21D is correspondent to the active area in which the drive transistor (Dx) and the select transistor (Sx) are formed in the unit pixel 100.

A test gate 22 in the unit test pixel 200 is overlapped predetermined portions of the test pixel active area 21A, 21B, 21C, 21D, which is formed simultaneously during a formation of gates of the transfer transistor (Tx), the reset transistor (Rx), the drive transistor (Dx) and the select transistor (Sx). It is noted that the test gate 22 is formed as a single conductive plate but each gate in the unit pixel 100 is formed, separately.

While there is an active area contact such as a floating diffusion contact (FD CT), a power supply voltage contact (VDD CT) and an output contact (output CT) and further a polysilicon contact such as a transfer contact (Tx CT) and a drive contact (Dx CT) in the unit pixel 100, there are only the active area contact, i.e., three contacts 23A, 23B, 23C, in the unit test pixel 200. Namely, there are a first contact 23A corresponding to the floating diffusion contact (FD CT), a second contact 23B corresponding to the VDD contact and a third contact 23C corresponding to the output contact in the unit test pixel 200, respectively. That is, in the unit test pixel 200, there is the first, the second and the third contacts 23A, 23B, 23C corresponding to the active area contact in the unit pixel 100 except the polysilicon contact.

Furthermore, a first metal interconnection 25A is formed over the first, the second and the third contacts 23A, 23B, 23C and a second metal interconnection 25B is formed over the first metal interconnection 25A, wherein the second metal interconnection 25B is connected to the first metal interconnection 25A through each via contact 24A, 24B, 24C.

Figure 3B:
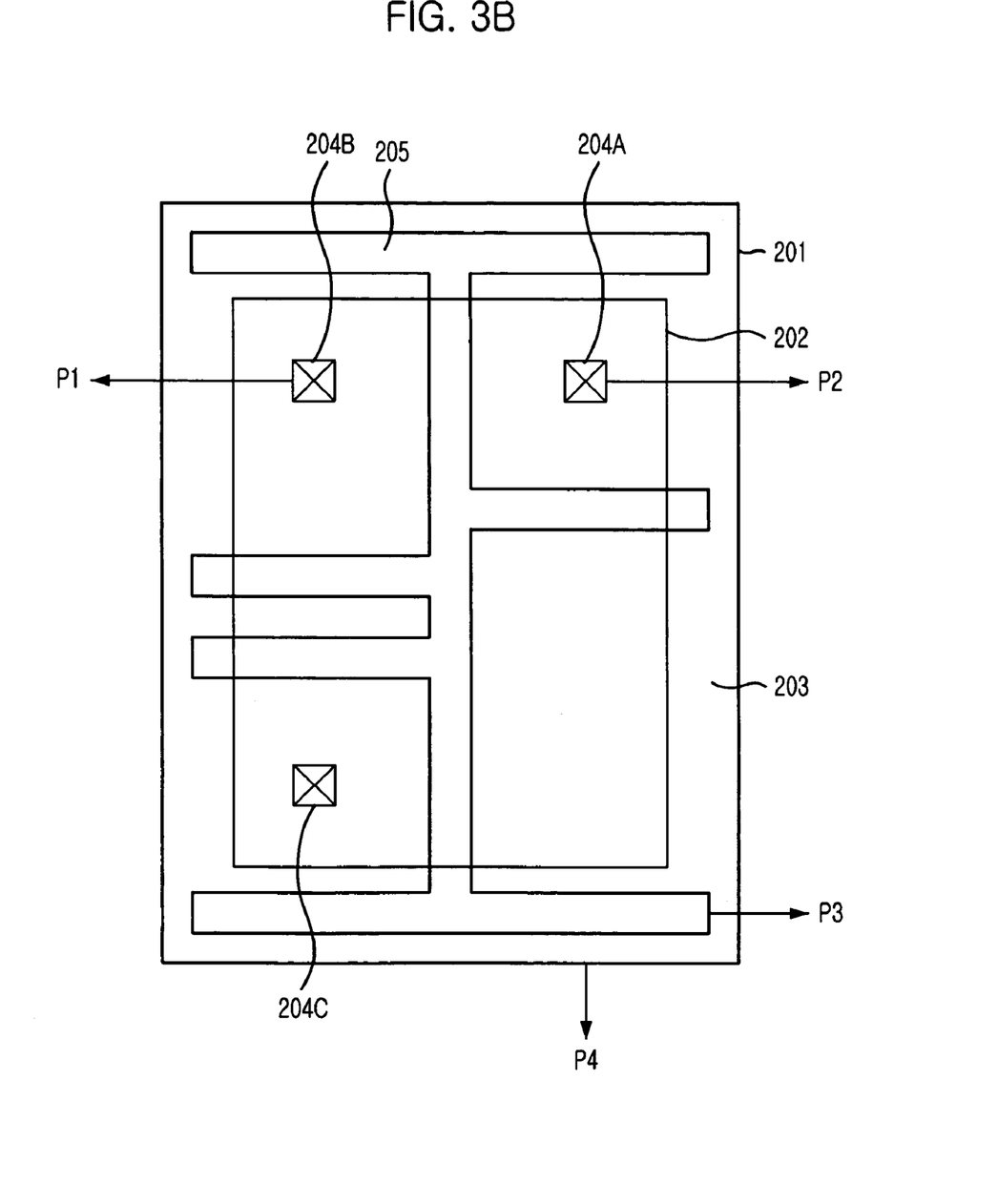
FIG. 3B is a schematic plane view setting forth the unit test pixel in accordance with the first preferred embodiment of the present invention.

Referring to FIG. 3B, there is shown a schematic unit test pixel for evaluating an image sensor property in accordance with the first preferred embodiment of the present invention.

In FIG. 3B, the unit test pixel includes a test pixel active area 202 defined in a semiconductor substrate 201 by a FOX 203, an active area contact 204A, 204B, 204C and a test gate 205 for evaluating a transistor characteristic. Herein, the active area contact has a first contact 204A disposed at one corner of the test pixel active area 202, a second contact 204B disposed at another corner of the test pixel active area 202 and a third contact 204C disposed at the other corner of the test pixel active area 202. In addition, a first test pad (P1), a second test pad (P2), a third test pad (P3) and a fourth test pad (P4) are connected to the second contact 204B, the first contact 204A, the test gate 205 and the semiconductor substrate 201, respectively. Alternatively, the second test pad (P2) can be connected to the third contact 204C.

The inventive unit test pixel of four-point probes has an advantage that it is possible to evaluate information such as a contact resistance, a leakage current or the like resulted from the test gate 205 and a plurality of contacts, respectively as well as simultaneously.

Figure 4:
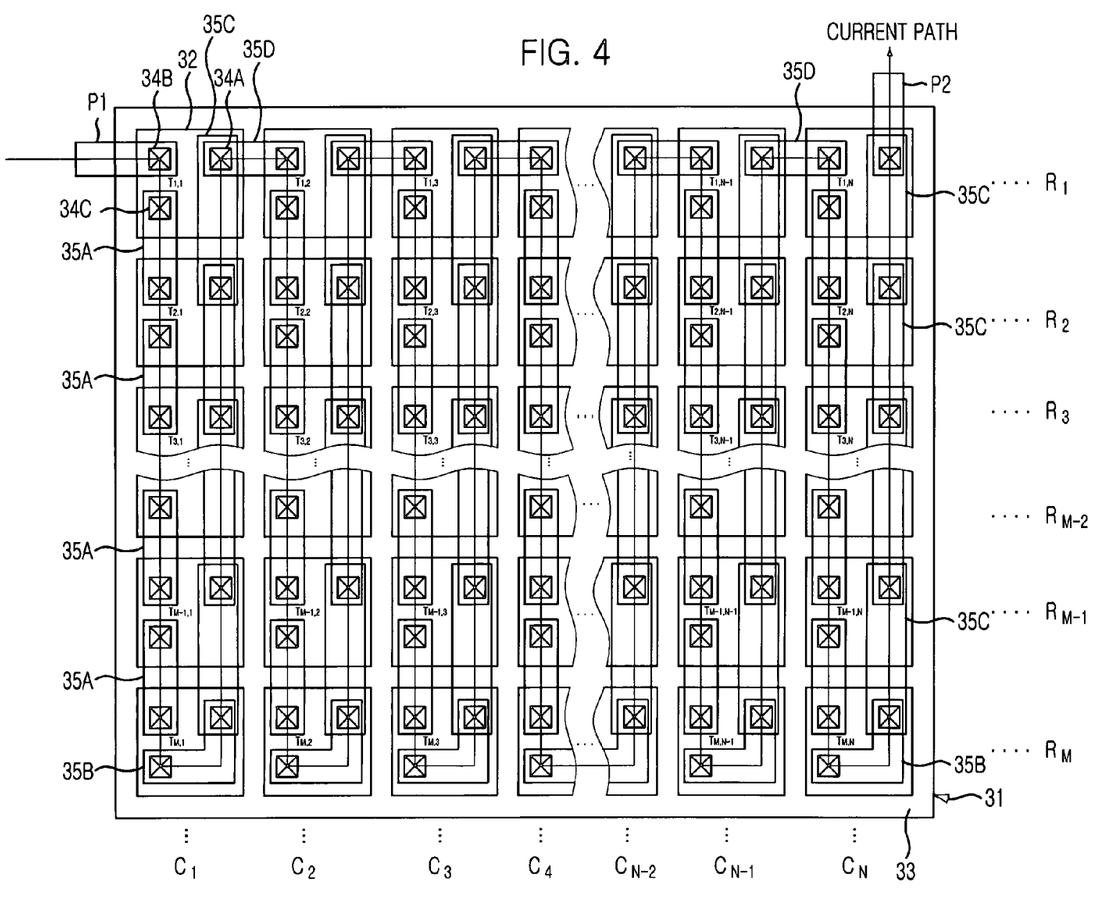
FIG. 4 is a plane view setting forth a test pixel having a plurality of unit test pixels for evaluating a pixel quality in accordance with a second preferred embodiment of the present invention.

Referring to FIG. 4, there is shown a test pixel having M×N unit test pixels therein in accordance with a second preferred embodiment of the present invention, wherein each unit test pixel has been described already in FIGS. 3A and 3B. In the second embodiment, there are M number of unit test pixels in a column direction and N number of unit test pixels in a row direction, wherein one unit test pixel is interconnected to adjacent unit test pixels through a contact chain.

In FIG. 4, the inventive test pixel of the second embodiment includes a test pixel active area 32 defined in a semiconductor substrate 31 by a FOX 33, an active area contact having a first contact 34A, a second contact 34B and a third contact 34C, a contact chain having a first, a second, a third and a fourth metal interconnection 35A, 35B, 35C, 35D, a test pad having a first test pad (P1) and a second test pad (P2) and a test gate (not shown). Herein, each unit test pixel has an active area of same configuration corresponding to an active area of each unit pixel in a CMOS image sensor, wherein the unit test pixel is connected to adjacent unit test pixels through the metal interconnections 35A, 35B, 35C, 35D. The active area contact 34A, 34B, 34C are disposed at three corners of the active area 32 which are depicted schematically for the sake of convenience. In particular, the first contact 34A, the second contact 34B and the third contact 34C disposed at three corners of the active area 32 are correspondent to an active area contact in the unit pixel such as a floating diffusion contact (FD CT), a VDD contact (VDD CT) and an output contact, respectively.

Meanwhile, the first test pad (P1) is connected to a second contact 34B in a unit test pixel arrayed in a first row and a first column and the second test pad (P2) is connected to a first contact 34A in a unit test pixel arrayed in a first row and an Nth column, wherein a test current flows from the first test pad (P1) to the second test pad (P2). Herein, though a third test pad (P3) is connected to the test gate and a fourth test pad (P4) is connected to the semiconductor substrate 31, these are not shown in FIG. 4 for convenience sake.

The first, the second, the third and the fourth metal interconnections 35A, 35B, 35C, 35D are interconnected to each other, thereby forming the contact chain crooked up and down for applying the test current vertically through the first, the second and the third contacts 34A, 34B, 34C. The more detail illustration for the contact chain will be described as followings.

To begin with, the first metal interconnection 35A connects a third contact 34C in a unit test pixel arrayed in an Rth row and a Cth column to a second contact 34B arrayed in a unit test pixel arrayed in an (R+1)th row and the Cth column in which R is a positive integer ranging from 1 to M−1 and C is the positive integer ranging from 1 to N. Furthermore, the second metal interconnection 35B connects a third contact 34C to a first contact 34A in a unit test pixel arrayed in an Mth row. In addition, the third metal interconnection 35C connects a first contact 34A in a unit test pixel to a first contact 34A in an adjacent unit test pixel in a column direction. Finally, the fourth metal interconnection 35D connects a first contact 34A in a unit pixel arrayed in the first row and a Qth column to a second contact 34B in a unit pixel arrayed in the first row and a (Q+1)th column, in which Q is a positive integer in a range of 1 to N−1.

In the inventive test pixel of the second embodiment, a plurality of active contacts 34A, 34B, 34C are interconnected through the contact chain having a shape crooked up and down so that the test current flows in the test pixel through all the active area contacts 34A, 34B, 34C. That is, the test current flows in a vertical direction in the test pixel. Therefore, it is possible to evaluate abnormality of the contact resistance or the leakage current at the active area contacts 34A, 34B, 34C corresponding to a floating diffusion contact (FD CT), a VDD contact (VDD CT) and an output contact in the unit pixel by measuring the voltage and the test current passing the active area contact 34A, 34B and 34C in the test pixel when the test gate (not shown) is turned on.

Figure 5:
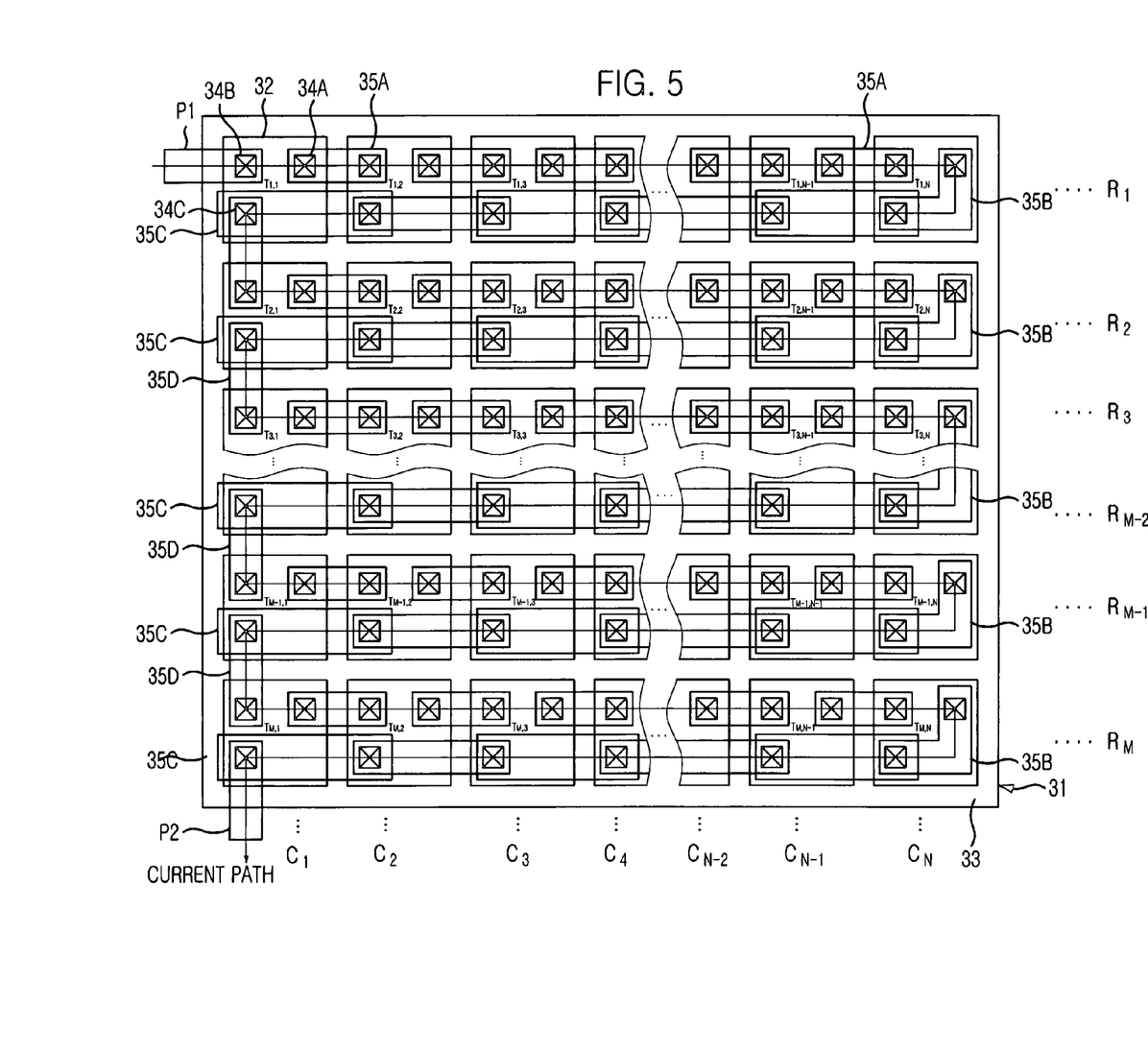
FIG. 5 is a plane view setting forth a test pixel having a plurality of unit test pixels for evaluating a pixel quality in accordance with a third preferred embodiment of the present invention.

Referring to FIG. 5, there is shown a test pixel having M×N unit test pixels therein in accordance with a third preferred embodiment of the present invention, wherein each unit test pixel has been described already in FIGS. 3A and 3B. In the third embodiment, there are M number of unit test pixels in a column direction and N number of unit test pixels in a row direction, wherein one unit test pixel is interconnected to adjacent unit test pixels through a contact chain.

In FIG. 5, the inventive test pixel of the third embodiment includes a test pixel active area 32 defined in a semiconductor substrate 31 by a FOX 33, an active area contact having a first contact 34A, a second contact 34B and a third contact 34C, a contact chain having a first, a second, a third and a forth metal interconnection 35A, 35B, 35C, 35D, a test pad having a first test pad (P1) and a second test pad (P2) and a test gate (not shown). Herein, each unit test pixel has an active area of same configuration corresponding to an active area of each unit pixel in a CMOS image sensor, wherein the unit test pixel is connected to adjacent unit test pixels through the metal interconnections 35A, 35B, 35C, 35D. The active area contact 34A, 34B, 34C are disposed at three corners of the active area 32 which are depicted schematically for the sake of convenience. In particular, the first contact 34A, the second contact 34B and the third contact 34C disposed at three corners of the active area 32 are correspondent to an active area contact in the unit pixel such as a floating diffusion contact (FD CT), a VDD contact (VDD CT) and an output contact, respectively.

Meanwhile, the first test pad (P1) is connected to a second contact 34B in a unit test pixel arrayed in a first row and a first column and the second test pad (P2) is connected to a third contact 34C in a unit test pixel arrayed in an Mth row and the first column, wherein a test current flows from the first test pad (P1) to the second test pad (P2). Herein, though a third test pad (P3) is connected to the test gate and a fourth test pad (P4) is connected to the semiconductor substrate 31, these are not shown in FIG. 4 for convenience sake.

The first, the second, the third and the fourth metal interconnections 35A, 35B, 35C, 35D are interconnected to each other, thereby forming the contact chain like a zigzag shape for applying the test current horizontally through the first, the second and the third contacts 34A, 34B, 34C. The more detail illustration for the contact chain will be described as followings.

To begin with, the first metal interconnection 35A connects a first contact 34A in a unit test pixel arrayed in a Pth row and a Qth column to a second contact 34B arrayed in a unit test pixel arrayed in the Pth row and the (Q+1)th column in which P is a positive integer ranging from 1 to M and Q is the positive integer ranging from 1 to N−1. Furthermore, the second metal interconnection 35B connects a first contact 34A to a third contact 34C in a unit test pixel arrayed in an Nth column. In addition, the third metal interconnection 35C connects a third contact 34C in a unit test pixel to a third contact 34C in an adjacent unit test pixel in a row direction. Finally, the fourth metal interconnection 35D connects a third contact 34A in a unit pixel arrayed in an Rth row and the first column to a second contact 34B in a unit pixel arrayed in an (R+1)th row and the first column, in which R is a positive integer in a range of 1 to M−1.

In the inventive test pixel of the third embodiment, a plurality of active contacts 34A, 34B, 34C are interconnected through the contact chain having a zigzag shape so that the test current flows horizontally in the test pixel through all the active area contacts 34A, 34B, 34C. That is, the test current flows in a horizontal direction in the test pixel. Therefore, it is possible to evaluate abnormality of the contact resistance or the leakage current at the active area contacts 34A, 34B, 34C corresponding to a floating diffusion contact (FD CT), a VDD contact (VDD CT) and an output contact in the unit pixel by measuring the voltage and the test current passing the active area contact 34A, 34B and 34C in the test pixel when the test gate (not shown) is turned on.

Figure 6:
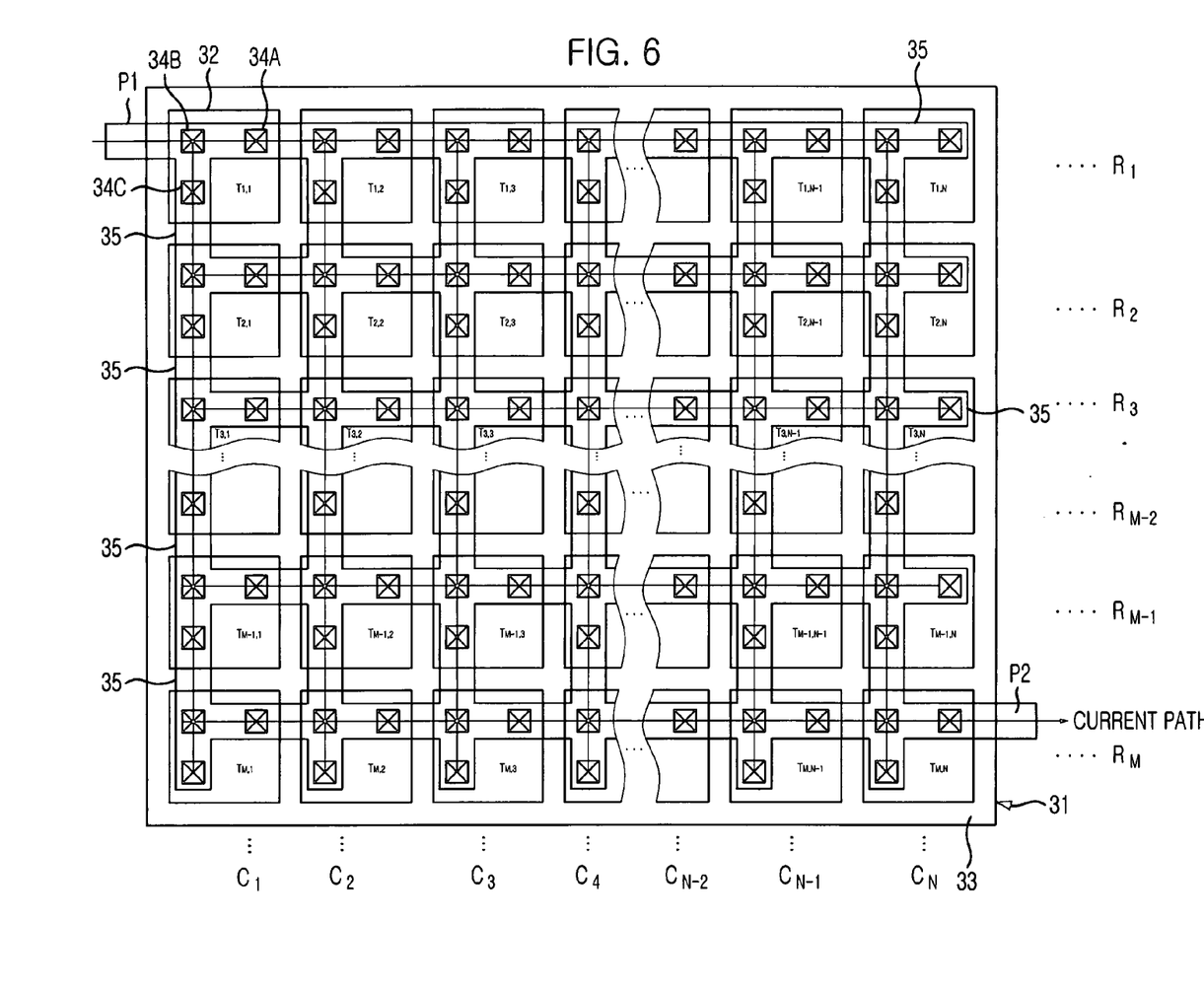
FIG. 6 is a plane view setting forth a test pixel having a plurality of unit test pixels for evaluating a pixel quality in accordance with a fourth preferred embodiment of the present invention.

Referring to FIG. 6, there is shown a third test pixel layout having M×N unit test pixels therein in accordance with a fourth preferred embodiment of the present invention, wherein each unit test pixel has been described already in FIGS. 3A and 3B. In the third test pixel layout, there are M number of unit test pixels in a column direction and N number of unit test pixels in a row direction, wherein one unit test pixel is interconnected to adjacent test pixels through a contact chain like a mesh type.

In FIG. 6, the inventive test pixel of the third layout includes a test pixel active area 32 defined in a semiconductor substrate 31 by a FOX 33, an active area contact having a first contact 34A, a second contact 34B and a third contact 34C, a metal interconnection 35 and a test gate (not shown). Herein, all the active area contacts 34A, 34B, 34C are interconnected through one metal interconnection 35 like the mesh type.

Meanwhile, a first test pad (P1) is connected to a second contact 34B in a unit test pixel arrayed in a first row and a first column and the second test pad (P2) is connected to a first contact 34A in a unit test pixel arrayed in an Mth row and an Nth column. Herein, though a third test pad (P3) is connected to the test gate and a fourth test pad (P4) is connected to the semiconductor substrate 31, these are not shown in FIG. 4 for convenience sake.

In the fourth embodiment, since all the active area contacts 34A, 34B, 34C are interconnected through the metal interconnection 35, i.e., a single metal line, the test current flows in a horizontal and a vertical direction simultaneously. That is, the test current doest not flow via each active area contact but the test current is applied to the active area contact 34A, 34B, 34C instantly through the metal interconnection 35. Accordingly, the third test pixel layout has an advantage to measure a leakage current of a unit pixel array in the CMOS image sensor more accurately in comparison with the second and the third embodiments.

Figure 7:
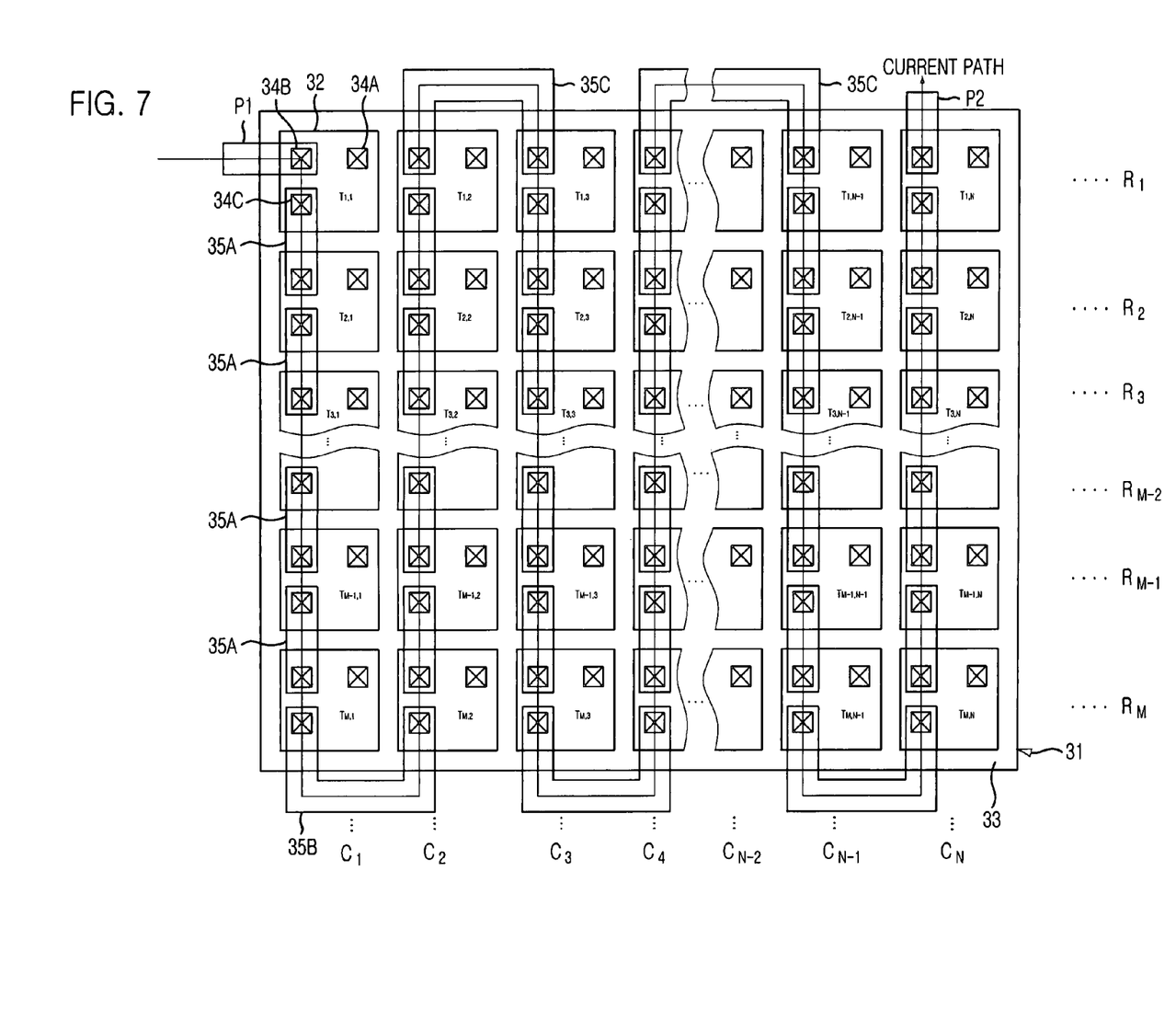
FIG. 7 is a plane view setting forth a test pixel having a plurality of unit test pixels for evaluating a pixel quality in accordance with a fifth preferred embodiment of the present invention.

Referring to FIG. 7, there is shown a fourth test pixel layout having M×N unit test pixels therein in accordance with a fifth preferred embodiment of the present invention, wherein each unit test pixel has been described already in FIGS. 3A and 3B. In the fourth test pixel layout, there are M number of unit test pixels in a column direction and N number of unit test pixels in a row direction, wherein one unit test pixel is interconnected to adjacent test pixels through a contact chain.

In FIG. 7, the inventive test pixel of the fifth embodiment includes a test pixel active area 32 defined in a semiconductor substrate 31 by a FOX 33, an active area contact having a first contact 34A, a second contact 34B and a third contact 34C, a contact chain having a first, a second, and a third metal interconnection 35A, 35B, 35C, a test pad having a first test pad (P1) and a second test pad (P2) and a test gate (not shown). Herein, each unit test pixel has an active area of same configuration corresponding to an active area of each unit pixel in a CMOS image sensor, wherein the unit test pixel is connected to adjacent unit test pixels through the metal interconnections 35A, 35B, 35C, 35D. The active area contact 34A, 34B, 34C are disposed at three corners of the active area 32 which are depicted schematically for the sake of convenience. In particular, the first contact 34A, the second contact 34B and the third contact 34C disposed at three corners of the active area 32 are correspondent to an active area contact in the unit pixel such as a floating diffusion contact (FD CT), a VDD contact (VDD CT) and an output contact, respectively.

Meanwhile, the first test pad (P1) is connected to a second contact 34B in a unit test pixel arrayed in a first row and a first column and the second test pad (P2) is connected to a second contact 34B in a unit test pixel arrayed in a first row and an Nth column, wherein a test current flows from the first test pad (P1) to the second test pad (P2). Herein, though a third test pad (P3) is connected to the test gate and a fourth test pad (P4) is connected to the semiconductor substrate 31, these are not shown in FIG. 7 for convenience sake.

The first, the second and the third metal interconnections 35A, 35B, 35C are interconnected to each other, thereby forming the contact chain crooked up and down for applying the test current vertically through the second and the third contacts 34B, 34C. It is noted that the first contact 34A corresponding to the floating diffusion contact (FD CT) of the unit pixel is not connected to the contact chain in the fifth embodiment. The more detail illustration for the contact chain will be described as followings.

To begin with, the first metal interconnection 35A connects a third contact 34C in a unit test pixel to a second contact 34B in an adjacent unit test pixel in a column direction. Furthermore, the second metal interconnection 35B connects a third contact 34C in a unit test pixel arrayed in an Mth row and a Qth column to a third contact 34C in a unit test pixel arrayed in the Mth row and a (Q+1)th column, in which Q is a positive integer ranging from 1 to N−1. Finally, the third metal interconnection 35C connects a second contact 34B in a unit test pixel arrayed in the first row and an Sth column to a second contact 34B in a unit test pixel arrayed in the first row and an (S+1)th column, in which S is a positive integer ranging from 2 to N−1.

In the inventive test pixel of the fifth embodiment, the interconnection configuration is similar to that of the second embodiment so that the test current flows in a vertical direction like a contact chain having a shape crooked up and down. However, in accordance with the fifth embodiment, the first contact 34A is not interconnected to either the second contact 34B or the third contact 34C. Thus, the test pixel of the fifth embodiment can be utilized for evaluating the active area contact in the unit pixel array except the floating diffusion contact (FD CT). Accordingly, it is possible to detect accurately which active contact is abnormal by comparing a measured data resulted from the first pattern layout and the fourth test pixel layout.

Figure 8:
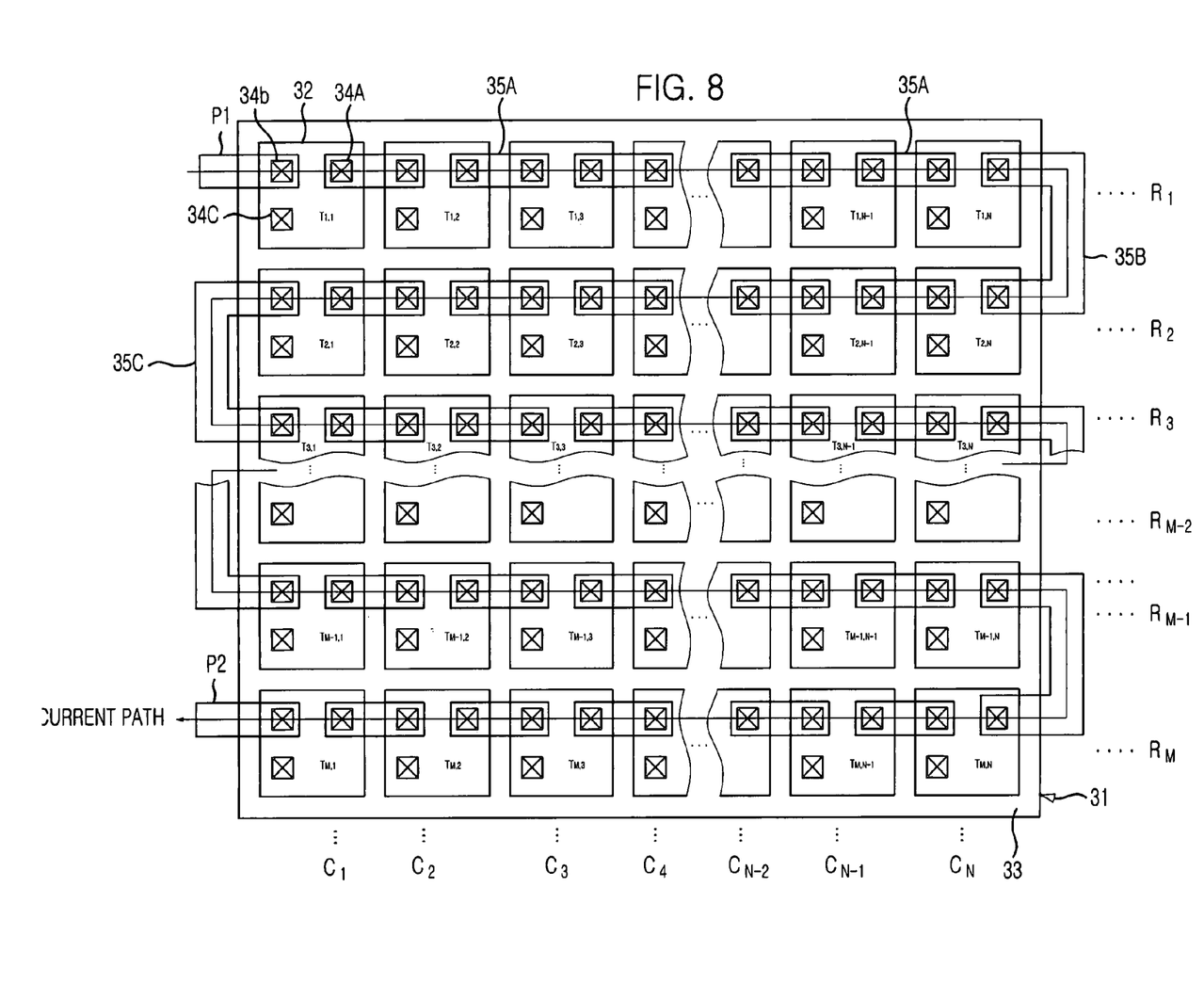
FIG. 8 is a plane view setting forth a test pixel having a plurality of unit test pixels for evaluating a pixel quality in accordance with a sixth preferred embodiment of the present invention.

Referring to FIG. 8, there is shown a test pixel having M×N unit test pixels therein in accordance with a sixth preferred embodiment of the present invention, wherein each unit test pixel has been described already in FIGS. 3A and 3B. In the sixth embodiment, there are M number of unit test pixels in a column direction and N number of unit test pixels in a row direction, wherein one unit test pixel is interconnected to adjacent test pixels through a contact chain.

In FIG. 8, the inventive test pixel of the sixth embodiment includes a test pixel active area 32 defined in a semiconductor substrate 31 by a FOX 33, an active area contact having a first contact 34A, a second contact 34B and a third contact 34C, a contact chain having a first, a second and a third metal interconnection 35A, 35B, 35C, a test pad having a first test pad (P1) and a second test pad (P2) and a test gate (not shown). Herein, each unit test pixel has an active area of same configuration corresponding to an active area of each unit pixel in a CMOS image sensor, wherein the unit test pixel is connected to adjacent unit test pixels through the metal interconnections 35A, 35B, 35C. Each active area contact 34A, 34B, 34C is disposed at three corners of the active area 32 which are depicted schematically for the sake of convenience. In particular, the first contact 34A, the second contact 34B and the third contact 34C disposed at three corners of the test pixel active area 32 are correspondent to an active area contact in the unit pixel such as a floating diffusion contact (FD CT), a VDD contact (VDD CT) and an output contact, respectively.

Meanwhile, the first test pad (P1) is connected to a second contact 34B in a unit test pixel arrayed in a first row and a first column and the second test pad (P2) is connected to a second contact 34B in a unit test pixel arrayed in an Mth row and the first column, wherein a test current flows from the first test pad (P1) to the second test pad (P2). Herein, though a third test pad (P3) is connected to the test gate and a fourth test pad (P4) is connected to the semiconductor substrate 31, these are not shown in FIG. 4 for convenience sake.

The first, the second and the third metal interconnections 35A, 35B, 35C are interconnected to each other, thereby forming the contact chain like a zigzag shape for applying the test current horizontally through the first and the second contacts 34A, 34B. The more detail illustration for the contact chain will be described as followings.

To begin with, the first metal interconnection 35A connects a first contact 34A in a unit test pixel to a second contact in an adjacent unit test pixel in a row direction. Furthermore, the second metal interconnection 35B connects a first contact 34A in a unit test pixel arrayed in an Rth row and an Nth column to a first contact in a unit test pixel arrayed in an (R+1)th row and the Nth column, in which R is a positive integer ranging from 1 to M−1. Finally, the third metal interconnection 35C connects a second contact 34B in a unit test pixel arrayed in a Tth row and the first column to a second contact 34B in a unit test pixel arrayed in a (T+1)th row and the first column, in which T is a positive integer ranging from 2 to M−1.

In the inventive test pixel of the sixth embodiment, the interconnection configuration is similar to that of the third embodiment so that the test current flows in a horizontal direction like a contact chain having a zigzag shape. However, in accordance with the sixth embodiment, the third contact 34C is not interconnected to either the first contact 34A or the second contact 34B, wherein the third contact 34C is correspondent to the output contact in the unit pixel. Thus, the test pixel of the sixth embodiment can be utilized for evaluating the active area contact in the unit pixel array except the output contact. Accordingly, it is possible to detect accurately which active area contact is abnormal by comparing a measured data resulted from the third embodiment and the sixth embodiment.

As described above, the present invention provides an advantage that it is possible to evaluate which active contact is abnormal by measuring a contact resistance and a leakage current of a plurality of active area contacts 34A, 34B, 34C in the test pixel, thereby expecting a quality-controlled CMOS image sensor. Furthermore, since the test pixel is manufactured simultaneously during the fabrication of the CMOS image sensor, a manufacturing process for the test pixel can be simplified.

While the present invention has been described with respect to the particular embodiments, it will be apparent to those skilled in the art that various changes and modifications may be made without departing from the scope of the invention as defined in the following claims.

What is claimed is:

1. A test pixel array for evaluating a pixel quality for use in a CMOS image sensor having M×N number of unit test pixels corresponding to M×N number of unit pixels in which M and N are positive integers, the test pixel array comprising:
   a test pixel active area corresponding to each unit pixel active area;
   an active area contact having a first, a second and a third contacts disposed at predetermined locations of each test pixel active area;
   a contact chain in order for a test current to flow vertically through the first, the second and the third contacts;
   a test pad for applying a test current to the test pixel array; and
   a test gate of which a predetermined portion is overlapped over the test pixel active areas in the test pixel array.

2. The test pixel array as recited in claim 1, wherein the first, the second and the third contacts which are correspondent to the floating diffusion contact, the VDD contact and the output contact in each unit pixel, respectively.

3. The test pixel array as recited in claim 1, wherein the contact chain includes a first, a second, a third and a fourth metal interconnections, for providing a test current pathway.

4. The test pixel array as recited in claim 3, wherein the first metal interconnection connects a third contact in a unit test pixel arrayed in an Rth row and a Cth column to a second contact arrayed in a unit test pixel arrayed in an (R+1)th row and the Cth column in which R is a positive integer ranging from 1 to M−1 and C is the positive integer ranging from 1 to N.

5. The test pixel array as recited in claim 3, wherein the second metal interconnection connects a third contact to a first contact in a unit test pixel arrayed in an Mth row.

6. The test pixel array as recited in claim 3, wherein the third metal interconnection connects a first contact in a unit test pixel to a first contact in an adjacent unit test pixel in a column direction.

7. The test pixel array as recited in claim 3, wherein the fourth metal interconnection connects a first contact in a unit pixel arrayed in the first row and a Qth column to a second contact in a unit pixel arrayed in the first row and a (Q+1)th column, in which Q is a positive integer in a range of 1 to N−1.

8. The test pixel array as recited in claim 1, wherein the test pad includes:
   a first and a second test pads connected to the active area contact;
   a third test pad connected to the test gate; and
   a fourth test pad connected to the semiconductor substrate.

9. The test pixel array as recited in claim 8, wherein the first test pad is connected to a second contact in a unit test pixel arrayed in a first row and a first column and the second test pad is connected to a first contact in a unit test pixel arrayed in a first row and an Nth column.

* * * * *